United States Patent [19]
Schade, Jr.

[11] Patent Number: 5,307,023
[45] Date of Patent: Apr. 26, 1994

[54] NON-LINEAR OPERATIONAL TRANSCONDUCTANCE AMPLIFIER

[75] Inventor: Otto H. Schade, Jr., Caldwell, N.J.

[73] Assignee: Harris Corporation, Melbourne, Fla.

[21] Appl. No.: 962,309

[22] Filed: Oct. 16, 1992

[51] Int. Cl.$^5$ ............................................. H03F 3/45
[52] U.S. Cl. ........................................ 330/257; 330/288
[58] Field of Search ................ 330/257, 288; 323/315, 323/316

[56] References Cited

U.S. PATENT DOCUMENTS 4,567,444 1/1986 Okanobu ........................ 330/288 X
4,604,568 8/1986 Prieto ................................. 323/315
5,157,489 12/1992 Mizuide .............................. 323/315

Primary Examiner—James B. Mullins
Attorney, Agent, or Firm—Henry I. Schanzer; Ferdinand Romano; C. C. Krawczyk

[57] ABSTRACT

A non-linear current mirror amplifier includes a master diode-connected transistor in series with a resistor to provide a forward diode bias and a resistive drop. A slave transistor is forward biased by the forward diode bias and the resistive drop. A current splitter applies a fraction of an input current to the master diode-connected transistor.

17 Claims, 3 Drawing Sheets

5,307,023

NON-LINEAR OPERATIONAL TRANSCONDUCTANCE AMPLIFIER

FIELD OF THE INVENTION

The present invention relates to operational amplifiers and, more particularly, to operational transconductance amplifiers (OTA's), including non-linear operational transconductance amplifiers.

BACKGROUND OF THE INVENTION

In a non-linear operational transconductance amplifier the output current is a non-linear function of the input signal level, increasing at a faster rate than the signal at higher signal levels. Typically, such non-linear effect is readily achieved by the introduction of a resistance in a current mirror amplifier (CMA) which forms part of the signal gain path.

This is best explained with reference to the prior art circuit of FIG. 1 which shows a known operational transconductance amplifier. Referring to FIG. 1, the circuit includes a long-tailed differential pair of transistors (T1, T2) whose output currents (I1, I2) form the respective input currents of first (CMA1) and second (CMA2) current mirror amplifiers. The first current mirror amplifier (CMA1) produces a first output current (IO1), of first polarity relative to an output terminal (OUT1), which is applied to the output terminal (OUT1) of the operational transconductance amplifier. The second current mirror amplifier (CMA2) produces an output current IO2A which is mirrored by a third current mirror amplifier (CMA3) to produce an output current IO2 which is applied to the output terminal, and which is of opposite polarity to the first output current relative to the output terminal. That is, for the circuit of FIG 1, N1 "sinks" a current IO1 out of OUT1 and N3 "sources" a current IO2 into OUT1. Under conditions of zero differential signal input to the differential pair of transistors, the quiescent currents (IO1 and IO2) of the first and third current mirror amplifiers are equal and satisfy one another and thereby cause the output terminal to supply zero current to a load connected to OUT1. When a differential input signal causes the output currents of the differential pair of transistors to be unequal, the output currents IO1 and IO2 of are no longer equal and a net signal-current flows into or out of a load (not shown) connected to the output terminal (OUT1).

In a non-linear operational transconductance amplifier, typically each one of the first and second current mirror amplifiers includes an input diode-connected transistor (e.g., NA, NB) whose current is mirrored via an output transistor (e.g., N1, N2). Each one of the first and second CMAs are normally arranged to be non-linear by the introduction of an emitter series resistance (e.g., RA, RB) in the input diode-connected transistor or "master diode" side of the current mirror amplifier. Usually, the input diode-connected transistor (e.g., NA, NB) of the CMA has a larger size geometry than the output transistor (e.g., N1, N2), and the zero differential signal quiescent current in its emitter resistor produces a voltage drop which assures that the amplifier operates in a non-linear mode at a predetermined current level. Typical circuit applications are often near-optimal with similar current levels in the differential and output stages at zero signal. When the voltage drop which the input current causes across an emitter series resistance increases at higher signal levels, the output-current to input-current ratio (that is, the current gain) is caused to increase, providing an output drive capability and efficiency substantially exceeding that of a conventional linear amplifier.

Such an arrangement functions so long as the transistor current gains are very high, that is, so long as the base current requirements are negligibly small compared with the operating current levels.

In practice, typical transistor current gains may cause problems to arise. This can be understood from an example. For instance, consider the condition where the non-linear operational transconductance amplifier of FIG. 1 utilizes current mirror amplifiers wherein the input-to-output transistor geometry ratio of NA to N1 and NB to N2 is 10:1 (e.g., NA is ten times the size of N1). Assume further that under balanced conditions (i.e., I1=I2) and at a prescribed tail current IT of $2_o$ (where $I_o=I_1=I_2$) a voltage drop is produces across RA and RB which is equal to $(KT/q)(\ln 10)=60$ mV at 25° C., where K is Boltzmann's constant, T is the absolute temperature in degrees Kelvin, and q is the electrical charge on an electron. Under balanced conditions, the effect of the geometry ratio of 10:1 to reduce the current gain is counterbalanced by the prescribed voltage drop of 60 mV across the emitter series resistance, so that the resulting current gain will be unity.

Now, consider the situation with an input signal to the nonlinear operational transconductance amplifier sufficiently large so that all of the tail current flows through one transistor (e.g., T1). The input current to the corresponding current mirror amplifier (e.g., CMA1) is then doubled, from $I_o$ to $2I_o$. The voltage drop across the emitter series resistance (e.g., RA) will also double to 120 mV. Furthermore, the forward drop across the diode-connected input transistor (e.g., NA) of the current mirror amplifier (e.g., CMA1) will increase by 18 mV due to the doubling of the current through it. In accordance with well-known principles, the current gain of the current mirror amplifier will be 10 and its output current can increase to 20 times its zero differential signal current. Under these conditions, the base current requirement of the output transistor will be 20 times its quiescent base current requirement. In the current mirror amplifier configuration shown in FIG. 1, the base current requirement of the output transistor is directly supplied by the input current to the current mirror amplifier. Under quiescent conditions the base current requirement may well be a negligible demand upon the input current. However, 20 times that demand will, in general, interfere with proper operation to an undesirable extent. Thus, when such a current is subtracted from the input current, the postulated voltage drop of 120 mV across the emitter series resistance will be significantly reduced and, accordingly, the desired increase in current gain will not be realized for the current mirror. While it is possible to increase the size of the output device in order to reduce current gain fall-off at higher currents, the input device must be further proportionately increased in size in order to maintain the desired geometry ratio and it thereby tends to become unreasonably large.

SUMMARY OF THE INVENTION

In circuits embodying the invention a non-linear current mirror amplifier (CMA) includes an input terminal for receiving an input current and circuit splitting means coupled between the input terminal and a master transistor having a series emitter resistance for applying only a fraction of the input current to the master transistor. The fraction of the input current applied to the master transistor produces a voltage applied across the base-to-emitter of a slave transistor to produce an output current at an output terminal which is proportional to the input current.

In accordance with an aspect of the invention, a non-linear current mirror amplifier includes:

a master diode-connected transistor for receiving a bias current and for providing a forward diode drop in response thereto;

a resistance connected in series with the master diode-connected transistor for providing a resistive drop;

a slave transistor coupled to the master diode-connected transistor and the resistance for being forward biased by the forward diode bias and the resistive drop; and a current splitter for applying a fraction of an input current to the master diode-connected transistor.

In accordance with another aspect of the invention, a non-linear current mirror amplifier comprises:

an input terminal for receiving an input current;

an output terminal for providing an output current;

a first, diode connected master, transistor of a first conductivity type and having collector, base, and emitter electrodes, for conducting an emitter bias current and for developing a forward bias voltage between the emitter and the base electrodes, responsive to the bias current;

a resistance having a first end connected to the emitter electrode and a second end connected to a point of reference potential;

a second, slave, transistor of the first conductivity type and having collector, base, and emitter electrodes, the collector electrode connected to the output terminal, the base electrode being connected to the base electrode of the master transistor, and the emitter electrode being connected to the point of reference potential; and current splitting circuitry having an input connected to the input terminal and having first and second outputs for providing thereat respective first and second fractions of the input current, the first output being connected to the collector electrode of the master transistor for providing the first fraction of the input current thereto.

In accordance with another aspect of the invention, the second output of the current splitting circuitry is connected to the first end of the resistance.

In accordance with another aspect of the invention, the second output of the current splitting circuitry is connected to a point of reference potential.

In accordance with a further aspect of the invention, the current splitting circuitry comprises third and fourth transistors of opposite conductivity type to the first and second transistors, the third and fourth transistors being connected in master transistor and slave transistor current mirror configuration, with the third being connected in series with the collector-to-emitter path of the first, master, transistor.

In accordance with still a further aspect of the invention, the fourth transistor has its output connected to the first end of the resistance.

In accordance with yet a further aspect of the invention, the fourth transistor has its output connected to a point of reference potential.

In accordance with still yet a further aspect of the invention, the first, diode connected master, transistor includes emitter follower circuitry in a feedback connection forming the diode connected master transistor In accordance with yet another aspect of the invention, the first, diode connected master, transistor and the second, slave, transistor are of different geometries.

In accordance with still yet another aspect of the invention, a non-linear current mirror amplifier comprises:

diode connected transistor circuitry for receiving a bias current therethrough and for developing a forward bias voltage in response to the bias current;

resistance circuitry connected in series with the diode connected transistor circuitry for providing a resistive voltage drop in response to current therethrough;

output transistor circuitry connected across the diode connected transistor circuitry and the resistance circuitry for receiving the sum of the forward bias voltage and the resistive voltage drop as a forward base emitter bias voltage; and current splitting circuitry for providing a fractional portion of an input current to the diode connected transistor circuitry as the bias current.

In accordance with another aspect of the invention, an operational transconductance amplifier comprises:

first and second transistors having respective emitter electrodes, having respective base electrodes for receiving respective signals thereat, and having respective collector electrodes for providing respective first and second collector currents;

a source of a tail current connected to the emitters of the first and second transistors for operating them as a long-tailed pair amplifier;

a first non-linear current mirror amplifier including:

first current splitting circuitry coupled to the collector electrode of the first transistor for providing a first fractional portion of the first collector current;

first diode connected transistor circuitry for receiving the first fractional portion of the first collector current therethrough and for developing a first forward bias voltage in response to thereto;

first resistance circuitry connected in series with the first diode connected transistor circuitry for providing a first resistive voltage drop in response to current therethrough;

first output transistor circuitry connected across the first diode connected transistor circuitry and the first resistance circuitry for receiving the sum of the first forward bias voltage and the first resistive voltage drop as a forward base emitter bias voltage;

current mirror circuitry coupled to the collector electrode of the second transistor for providing a mirrored current equal to the second collector current;

a second non-linear current mirror amplifier including: second current splitting circuitry coupled to the current mirror circuitry for providing a first fractional portion of the mirrored current;

second diode connected transistor circuitry for receiving the first fractional portion of the mirrored current therethrough and for developing a second forward bias voltage in response to thereto;

second resistance circuitry connected in series with the second diode connected transistor circuitry for providing a second resistive voltage drop in response to current therethrough;

second output transistor circuitry connected across the second diode connected transistor circuitry and the second resistance circuitry for receiving the sum of the second forward bias voltage and the second resistive voltage drop as a forward base emitter bias voltage; and circuitry coupled to the first and second output transistor circuitry for combining outputs thereof.

BRIEF DESCRIPTION OF THE DRAWING

The invention will next be described in detail by way of exemplary embodiments with the aid of the drawing, in which.

DETAILED DESCRIPTION OF PREFERRED EMBODIMENTS

Figure 1:
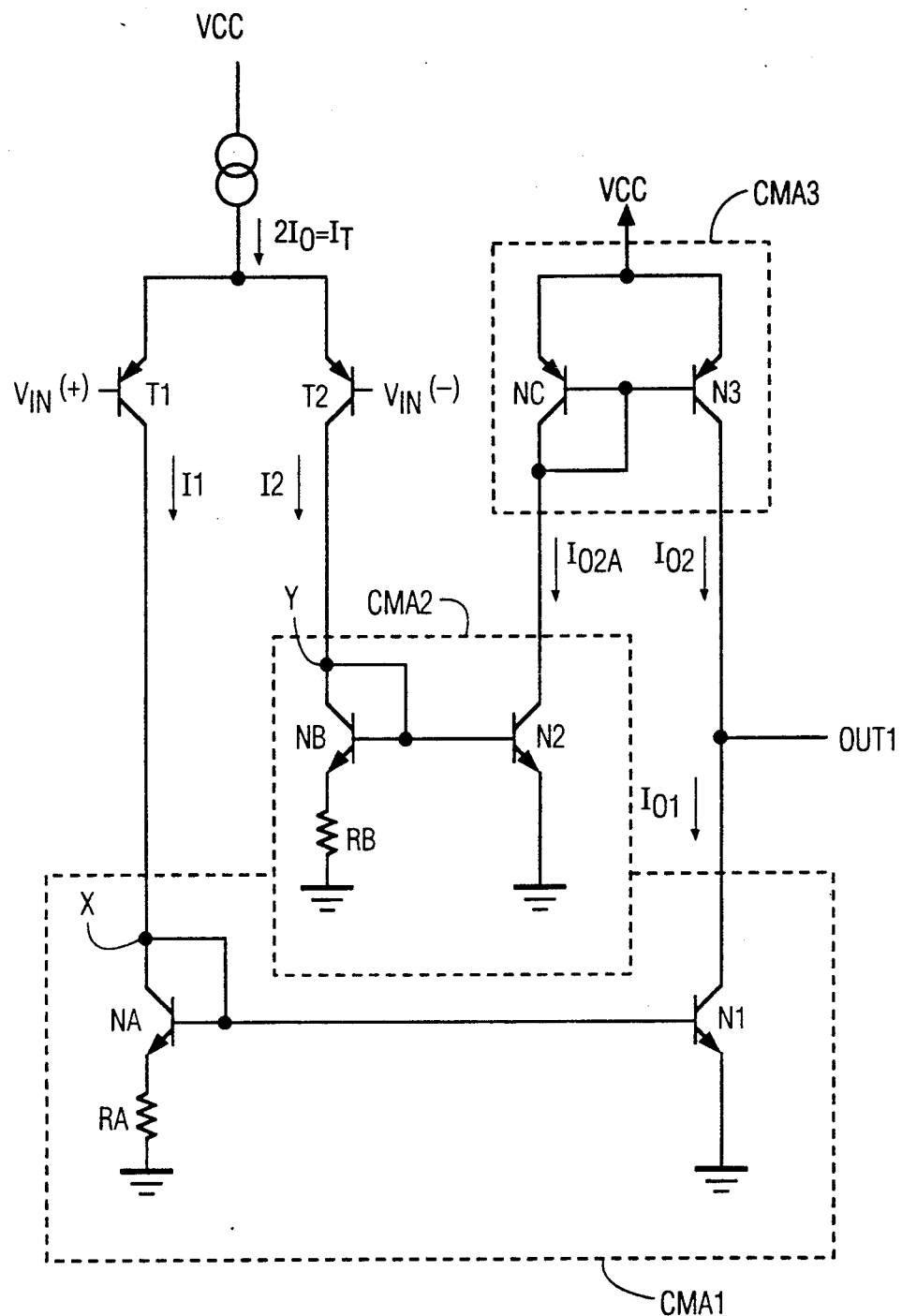
FIG. 1 is a schematic diagram of a prior art non-linear operational transconductance amplifier.
Figure 2:
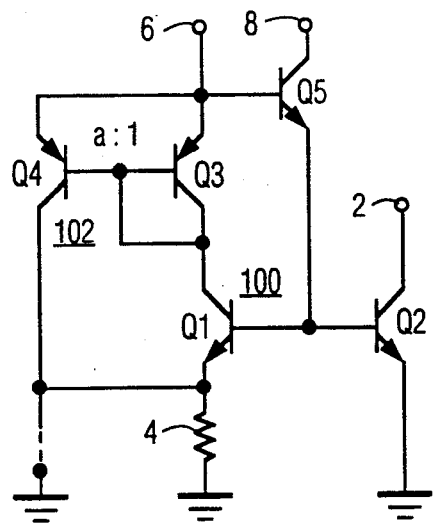
FIGS. 2 and 2A are schematic diagrams of current mirror amplifiers (CMAs) embodying the invention.

In the embodiment shown in FIG. 2, transistors Q1 and Q2 are the input and output transistors, respectively of a non-linear current mirror amplifier, generally indicated as 100. Transistor Q1 is also referred to herein as the master or master diode or diode-connected master transistor and transistor Q2 is also referred to herein as the slave transistor. Transistors Q1 and Q2 are of like conductivity type, here shown by way of example as NPN. The base electrodes of transistors Q1 and Q2 are connected together and the emitter electrode of transistor Q2 is connected to a point of a reference potential, here shown as ground and its collector electrode is connected to an output terminal 2 for providing current to a load, not shown. Transistors Q3 and Q4, of opposite conductivity type to transistors Q1 and Q2, here shown by way of example as PNP, constitute an auxiliary current mirror amplifier, generally indicated as 102. The active junction areas of transistors Q3 and Q4 are in the ratio of 1:a, respectively. The base and collector electrodes of transistor Q3 and the base electrode of transistor Q4 are connected in common to the collector electrode of transistor Q1. The collector electrode of transistor Q4 is connected to the emitter electrode of transistor Q1 and to one end of a resistance 4 whose other end is connected to ground. The emitter electrodes of transistors Q3 and Q4 are connected together and are further connected to the base electrode of a transistor Q5, of the same conductivity type as transistors Q1 and Q2, and to an input terminal 6 for receiving thereat an input current to be mirrored by current mirror amplifier 100. The source of the input current to terminal 6 is not shown but may be the collector of one of a differential pair of transistors as shown in FIG. 1. The emitter electrode of transistor Q5 is connected to the base electrodes of transistors Q1 and Q2. The collector electrode of transistor Q5 is connected to a supply terminal 8 for receiving thereat a supply of operating potential from a source, not shown.

In the discussion to follow it is assumed that the forward current gains (Betas) of the transistors used in the Figures are high enough such that the base currents need not be taken into account for the purpose of the present description. In operation, essentially all the input current supplied to terminal 6 divides into two main portions: a current into the emitter electrode of transistor Q3 and a current into the emitter electrode of transistor Q4, these currents being in the ratio of 1:a. The base currents of transistors Q3 and Q4 and the collector current of transistor Q3 constitute the collector current of transistor Q1. Transistor Q1 is biased into conduction by means of transistor Q5, whose emitter is connected to the joined bases of transistors Q1 and Q2, whereby Q5 provides current gain as an emitter-follower. Substantially all of the input current at terminal 6 is conducted by resistance 4 whose value is selected to provide a suitable voltage drop in series with the emitter electrode of transistor Q1. The voltage developed at the base electrode of transistor Q1 biases transistor Q2 into current mirroring conduction, subject to the KT/q-related offset voltage across resistance 4. The voltage developed at the base electrode of transistor Q1 represents the forward biased base emitter voltage of transistor Q1 corresponding to its emitter current density level plus the ohmic voltage drop across resistance 4. This ohmic voltage drop is typically chosen so that the current mirror amplifier will operate in a non-linear mode at a desired quiescent or output-current level. Thus, at very small current levels, the current mirror action between master transistor Q1 and slave transistor Q2 represents a constant current gain defined by their geometric ratio. But at greater current levels, the ohmic voltage drop across resistance 4 significantly supplements the forward biased base emitter voltage of transistor Q1. Since the voltage applied to the base electrode of transistor Q2 is equal to the sum of the ohmic voltage drop across resistance 4 and the forward biased base emitter voltage of transistor Q1, at greater current levels transistor Q2 is therefore biased into a conduction level which is higher than would correspond to the geometric ratio between transistors Q1 and Q2. Thus, the gain of current mirror amplifier 100 is greater at higher current levels at which this ohmic voltage drop becomes significantly large than at lower current levels.

The base current of transistor Q2 may become large, but this is not a problem because it is not drawn from the input current at terminal 6 but instead, from the supply at terminal 8. Furthermore, because the current splitting function of the auxiliary current mirror amplifier 102 reduces the emitter current density in transistor Q1, the geometry ratio of transistor Q1 to transistor Q2 need not be a large ratio as in the prior art, but may simply be 1:1 or even may be less than unity. It is also possible to connect the collector electrode of transistor Q4 to ground rather than to the emitter electrode of transistor Q1, as shown by the dashed line in FIGS. 2 and 3. In such case, the value of resistance 4 has to be increased by the ratio of (1+a)/1 to continue to provide the same voltage drop.

Figure 2A:
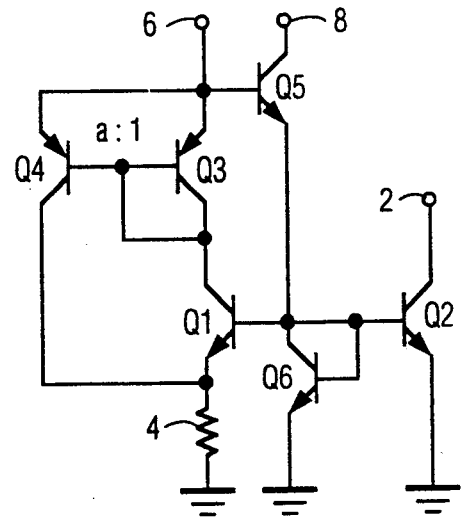

The non-linear current mirror amplifier shown in FIG. 2 may be modified as shown in FIG. 2A. Here, a diode connected transistor Q6 is connected between the base electrode of transistor Q2 and the (Q2 emitter) ground-reference potential. In this arrangement, the quiescent current through Q5 may be adjusted by the geometry ratio of Q6 and Q2 in order to improve its signal response; a trade-off against base-current loading of terminal 6. (This option appears with a 1:10 geometry ratio in the FIG. 4 circuit described below).

Figure 3:
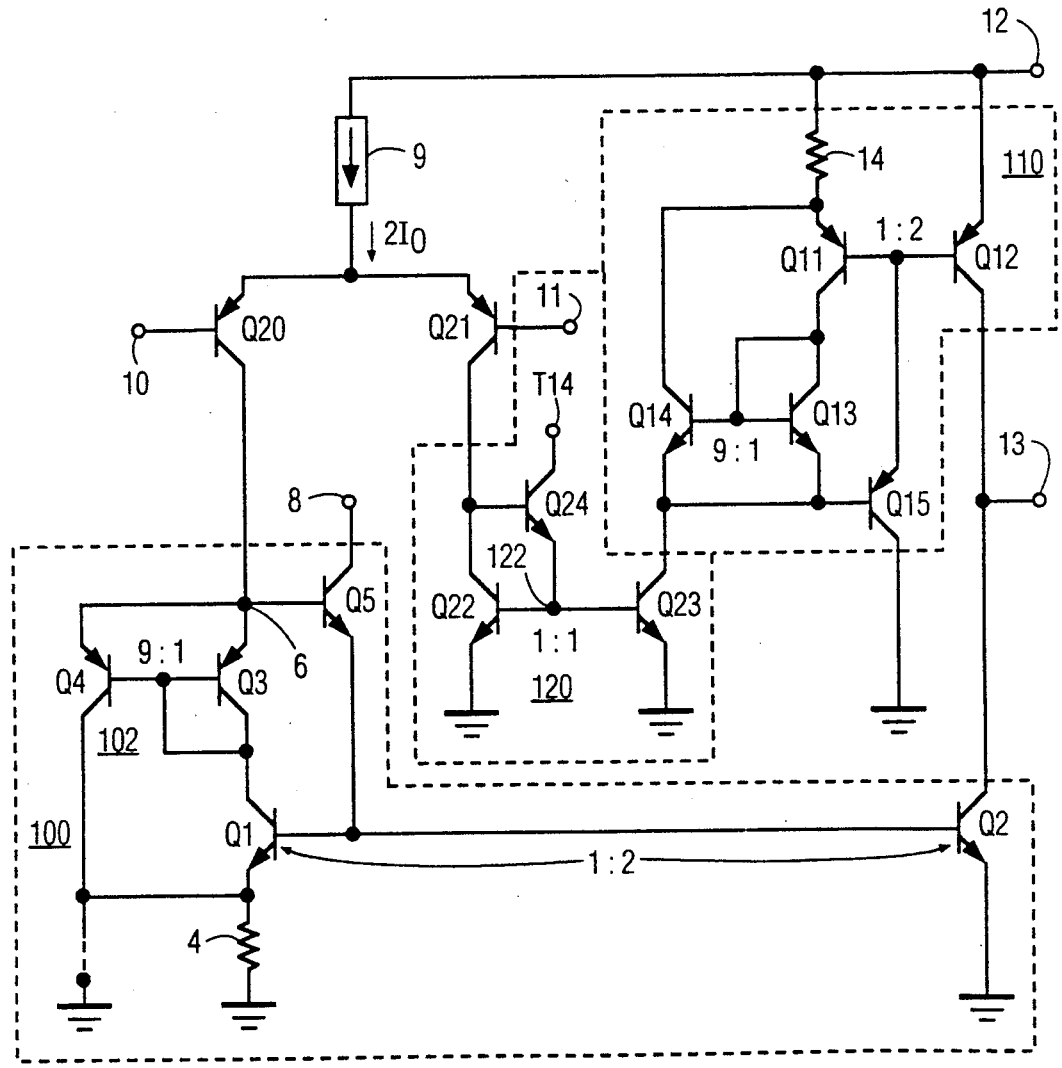
FIG. 3 is a schematic diagram of a non-linear operational transconductance amplifier embodying the invention.

FIG. 3 shows a non-linear operational transconductance amplifier in accordance with the invention, including the non-linear current mirror amplifier 100 of FIG. 2 and its reverse polarity complement, generally indicated as 110. Elements in FIG. 3 corresponding to those shown in FIG. 2 are identified by the same reference numbers and corresponding elements in the complementary circuit 110 are identified by similar numbers augment by 10. Thus, for example, transistor Q14 corresponds functionally to transistor Q4. Transistors Q20 and Q21 form a differential long-tailed pair supplied with tail current 2I° from a current source shown symbolically as a supply 9. Appropriate circuitry for providing a suitable tail current is shown, for example, in Schade and Kramer "A Low-Voltage BIMOS Op Amp", IEEE Journal of Solid State Circuits, Vol. SC-16, No. 6; December 1981, pp. 961 et seq., whose teachings are incorporated herein by reference. Transistor Q20 supplies its collector current to the joined emitter electrodes of transistors Q3 and Q4, which form the input of non-linear current mirror amplifier 100 whose output is formed by the collector electrode of transistor Q2 which is connected to an output terminal 13. Transistor Q21 supplies its collector current to a further 1:1 ratio current mirror amplifier 120 comprising grounded emitter transistor Q22 and transistor Q23. A base-current bypass transistor Q24 has its base electrode connected to the collector electrode of transistor Q22 and its emitter electrode connected to the joined base electrodes of transistors Q22 and Q23 at a node 122. The collector electrode of bypass transistor Q24 is connected to a terminal 14 for receiving a supply of operating potential thereat. The collector electrode of transistor Q23, which defines an output of the current mirror amplifier 120, is connected at node 61 to the input of non-linear current mirror amplifier 110 whose output defined by the collector electrode of transistor Q12 is connected to output terminal 13. Terminals 8 and 14 may be returned to terminal 12 to which is applied a source of positive operating potential or some other suitable voltage, not shown.

In operation, the collector current of transistor Q20 drives the input of non-linear current mirror amplifier 100, the collector current of transistor Q21 drives the input of current mirror amplifier 120, the output of current mirror amplifier 120, being defined by the collector electrode of transistor Q23 drives the input of non-linear current mirror amplifier 110. When the signal inputs to transistors Q20 and Q21 are balanced, the input current of non-linear current mirror amplifier 100 is equal to the input current of non-linear current mirror amplifier 110 which is provided by the output of the current mirror amplifier 120 at the collector electrode of transistor Q23. The output current of non-linear current mirror amplifier 100 flowing into the collector electrode of transistor Q2 then balances the output current of non-linear current mirror amplifier 110 flowing out of the collector electrode of transistor Q12. In the embodiment of FIG. 2, the geometry ratios of transistor Q4 to transistor Q3, and of transistor Q14 to transistor Q13 are in the same ratio (9:1), so that the zero differential signal tail current $2I_o$ is split in the same proportion within non-linear current mirror amplifiers 100 and 110. The current-density reduction in Q4 and Q14 provides the same base-emitter offset potential as would be provided in a ten times larger transistor at current $I_o$. Voltages of 60 mV at room temperature were chosen to be set up across each of resistances 4 and 14. The geometry ratios of transistor Q2 to transistor Q1, and of transistor Q12 to transistor Q11 are shown in FIG. 3 to be in the proportion of 2:1. Under balanced signal conditions, master transistor Q1 of non-linear current mirror amplifier 100 conducts an emitter current of $0.1I_o$. Because of the 60 mV drop across resistance 4 and the 2:1 geometry ratio between transistors Q2 and Q1, the current gain of non-linear current mirror amplifier 100 under balanced signal conditions is 2. Similar considerations apply to non-linear current mirror amplifier 110, so that the output idling current is equal to 2 $I_o$. When either transistor Q20 or transistor Q21 forming the differential long-tailed pair is toggled fully on, the input current to either non-linear current mirror amplifiers 100 or 110 is doubled to $2I_o$. By way of example, for the condition when Q20 is fully on the current through resistances 4 is then doubled from $I_o$ to $2I_o$ and the ohmic voltage drop across resistor 4 becomes 120 mV. The gain of non-linear current mirror amplifier 100 is then increased to 20. That is, the collector current of transistor Q2 drawn from output terminal 13 is 20 times the current $2I_o$ flowing into node 6 and through resistance 4. Hence, the output current sourced by Q2 is equal to $40I_o$.

In a similar manner for the condition when Q21 is fully on the collector current of Q21 is equal to $2I_o$ and is mirrored via CMA 120 comprised of Q22, Q24 and Q23 to draw a current of $2I_o$ out of node 61. The current through resistance 14 is then doubled from $I_o$ to $2I_o$ and the ohmic voltage across resistor 14 becomes 120 mV. The gain of non-linear CMA 110 increases to 20 whereby the collector current of Q12 into node 13 is $40I_o$. Therefore, an output drive current of + or $-40I_o$ becomes available with the circuit of FIG. 3.

With the use of high performance NPN and PNP bipolar devices such as are available in modern bipolar and BiMOS technologies, the circuit of FIG. 3 is capable of high performance over a wide range of supply voltage down to a level of 2 volts or so.

Figure 4:
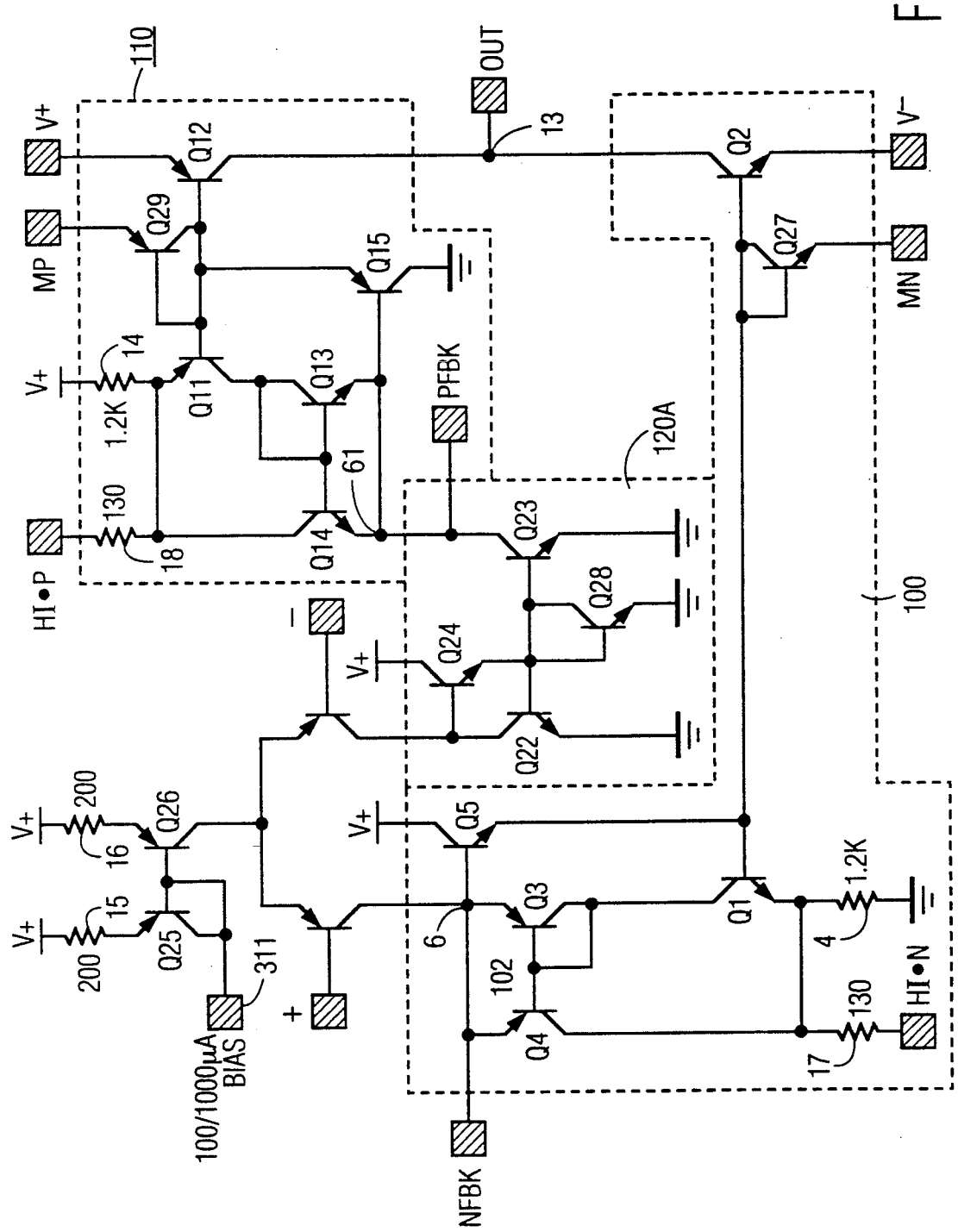
FIG. 4 shows a schematic diagram of another non-linear operational transconductance amplifier in accordance with the principles of the invention.

FIG. 4 shows a practical circuit with typical component values for production in BiMOS technology. Transistors Q20 and Q21 form a differential pair as in the circuit shown in FIG. 3, with tail current being supplied by a current mirror comprising transistors Q25 and Q26 and emitter resistors 15 and 16. A reference current from a source, not shown, is applied to a BIAS terminal 311 connected to the joined base electrodes of transistors Q25 and Q26 and to the collector electrode of transistor Q25.

Transistors Q1, Q2, Q3, Q4, and Q5 and resistance 4 form a non-linear CMA 100 as in the circuits shown in FIGS. 2 and 3, except that a diode connected transistor Q27 is connected between the joined base electrodes of transistors Q1 and Q2 and terminal MN, which permits quiescent-current adjustment in Q5 as previously described. A terminal NFBK for the application of a bandwidth-limiting feedback (compensation) capacitor is connected to the emitter electrode of transistor Q4.

Transistors Q11, Q12, Q13, Q14, and Q15 and resistance 14 form a non-linear CMA 110 as in the circuit shown in FIG. 3, except that a diode connected transistor Q29 is connected between the joined base electrode of transistor Q11 and Q12 and a terminal MP, to provide a function identical to that of terminal MN. A terminal PFBK for the application of compensation capacitance (similar to terminal NFBK) is connected to the emitter electrode of transistor Q14.

Terminals HI.N and HI.P coupled via resistors 17 and 18 to the emitters of Q1 and Q11, respectively provide an option for producing 60 mV resistor Potentials at a ten-times-higher bias current level.

Transistors Q22, Q23, and Q24 form a current mirror amplifier 120A as in the circuit 120 shown in FIG. 2, except that diode connected transistor Q28 is connected between the joined base electrode of transistors Q22 and Q23 and ground to enhance signal response.

The interconnection of current differential pair Q20 and Q21, current mirror amplifier 100, current mirror amplifier 110, and current mirror amplifier 120 follows the arrangement shown in FIG. 3.

However it should be appreciated that the collector of Q21 could be connected to a non-linear CMA like CMA 100 with the output of the non-linear CMA being mirrored via a linear CMA to output terminal 13.

While the invention has been described by way of various embodiments, it will be understood that various changes and modifications will be apparent to one skilled in the art without departing from the spirit of the invention. For example, the conductivity type of devices may be reversed. Furthermore, a more elaborate type of differential pair, such as Darlington connected transistors may be employed. MOSFET devices may be used in the tail pair, current splitters and as source-follower buffers in the non-linear CMAs. These and like changes are contemplated to be within the scope of the invention, as defined by the claims following.

I claim:

1. A non-linear current mirror amplifier comprising: an input terminal for receiving an input current; an output terminal for providing an output current; a first, master, transistor of a first conductivity type having collector, base, and emitter electrodes, for conducting an emitter bias current and for developing a forward bias voltage between said emitter and said base electrodes, responsive to said bias current;
    a resistance having a first end connected to said emitter electrode and a second end connected to a point of reference potential;
    a second, slave, transistor of said first conductivity type having collector, base, and emitter electrodes, said slave transistor being connected at its collector electrode to said output terminal, at its base electrode to the base electrode of said master transistor, and at its emitter electrode to said point of reference potential;
    current splitting means having an input connected to said input terminal and having first and second outputs for providing thereat respective first and second predetermined and fixed fractions of said input current;
    means connecting said first output of said current splitting means to said collector electrode of said master transistor for providing said first fraction of said input current thereto and to the base-to-emitter of said slave and master transistors, the portion of the first fraction of the input current through the master transistor and said resistance for producing a voltage across the base-to-emitter of the slave transistor which is a continuous and direct function of the portion of the fraction of the input current for causing the slave transistor to pass a current which is a non-linear amplified function of the input current.

2. A non-linear current mirror amplifier as recited in claim 1, wherein said second output is connected to said first end of said resistance.

3. A non-linear current mirror amplifier as recited in claim 1, wherein said second output is connected to point of reference potential.

4. A non-linear current mirror amplifier as recited in claim 1, wherein said current splitting means comprises third and fourth transistors of a second, opposite, conductivity type to said first conductivity type, said third and fourth transistors being connected in master transistor and slave transistor current mirror configuration wherein said third transistor of said current splitting means is connected in series with said master transistor of said first conductivity type.

5. A non-linear current mirror amplifier as recited in claim 4, wherein said fourth transistor defining the slave transistor of said current splitting means has its output connected to said first end of said resistance.

6. A non-linear current mirror amplifier as recited in claim 4, wherein said fourth transistor defining the slave transistor of said current splitting means has its output connected to said point of reference potential.

7. A non-linear current mirror amplifier as recited in claim 1, wherein said master transistor includes an emitter follower transistor of said first conductivity type having its base connected to said input terminal and its emitter connected to the base of said master transistor whereby said master transistor is a diode connected master transistor.

8. A non-linear current mirror amplifier as recited in claim 1, wherein said master transistor and said slave transistor are of different geometries.

9. An operational transconductance amplifier comprising:
    first and second transistors having respective emitter electrodes, having respective base electrodes for receiving respective signals thereat, and having respective collector electrodes for providing respective first and second collector currents;
    a source of a tail current connected to said emitters for operating said first and second transistors as a long-tailed pair amplifier;
    a first non-linear current mirror amplifier including: first current splitting means coupled to said collector electrode of said first transistor for providing a first fractional portion of said first collector current;
    first diode connected transistor means for receiving said first fractional portion of said first collector current therethrough and for developing a first forward bias voltage in response thereto;
    first resistance means connected in series with said first diode connected transistor means for providing a first resistive voltage drop in response to current therethrough;
    first output transistor means connected across said first diode connected transistor means and said first resistance means for receiving the sum of said first forward bias voltage and said first resistive voltage drop as a forward base emitter bias voltage;
    current mirror means coupled to said collector electrode of said second transistor for providing a mirrored current which is substantially equal to said second collector current;
    a second non-linear current mirror amplifier including: second current splitting means coupled to said current mirror means for providing a first fractional portion of said mirrored current;
    second diode connected transistor means for receiving said first fractional portion of said mirrored current therethrough and for developing a second forward bias voltage in response to thereto;
    second resistance means connected in series with said second diode connected transistor means for providing a second resistive voltage drop in response to current therethrough;

second output transistor means connected across said second diode connected transistor means and said second resistance means for receiving the sum of said second forward bias voltage and said second resistive voltage drop as a forward base emitter bias voltage; and means coupled to said first and second output transistor means for combining outputs thereof.

10. An operational transconductance amplifier as recited in claim 9 wherein said first and second current splitting means each comprises:

current mirror means including master and slave transistors having joined emitter electrodes and having joined base electrodes connected to the collector electrode of said master transistor, said joined emitter electrodes forming a current input point for said current splitting means and the respective collector electrodes of said master and slave transistors each conducting a fractional portion of a current supplied to said input point.

11. A non-linear current mirror amplifier comprising:

an input terminal for the application thereto of an input current;

an output terminal for producing thereat a current which is a continuous, direct and amplified version of said input current;

a first diode connected transistor means for receiving a bias current therethrough and for developing a forward bias voltage in response to said bias current;

current splitting means for providing a predetermined and fixed fractional portion of said input current to said first diode connected transistor means as said bias current.

resistance means connected in series with said first diode connected transistor means for providing a resistive voltage drop in response to current therethrough, said resistance means being connected between said first diode connected transistor means and a point of reference potential;

a second output transistor means having a base-to-emitter region connected across said first diode connected transistor means and said resistance means for receiving the sum of said forward bias voltage and said resistive voltage drop as a forward base emitter bias voltage with its emitter region being connected to said reference potential; and said second output transistor means having a collector region connected to said output terminal.

12. A non-linear current mirror amplifier as recited in claim 11, wherein said first diode connected transistor means and said second output transistor means are comprised of transistors of one conductivity type and wherein said current splitting means comprises third and fourth transistors of a second conductivity type, opposite to said first conductivity type and having respective emitters connected to an input terminal for receiving said input current.

13. A non-linear current mirror amplifier as recited in claim 12, wherein said third transistor of said current splitting means is diode connected and is connected in series connection with said first diode connected transistor means for conducting a first fractional portion of said input current and said fourth transistor of said current splitting means is connected to said third transistor as a slave transistor for conducting a second fractional portion of said input current.

14. A non-linear current mirror amplifier as recited in claim 13, wherein said second fractional portion of said input current is coupled to an interconnection point of said first diode connected transistor means and said resistance means.

15. A non-linear current mirror amplifier as recited in claim 12 wherein said first diode connected transistor means includes a first transistor and an emitter follower transistor;

wherein said second output transistor means includes a second transistor;

wherein said first, second and emitter follower transistors are of the same, one conductivity type;

wherein each one of said first, second, third, fourth, and emitter follower transistors have base, emitter and collector electrodes;

wherein the emitter of said third and fourth transistors and the base of said emitter follower transistor are connected to said input terminal;

wherein the bases of said third and fourth transistor and the collector of said third transistor are connected to the collector of said first transistor;

wherein the emitter of said emitter follower is connected to the bases of said first and second transistors;

wherein the resistance means is connected between the emitter of said first transistor and a point of reference potential; and wherein the emitter of said second transistor is connected to said point of reference.

16. A non-linear current mirror amplifier as recited in claim 11, wherein said first diode connected transistor means of said first conductivity type is diode connected by way of emitter follower feedback means.

17. A non-linear current mirror amplifier comprising:

an input terminal for receiving an input current;

an output terminal for providing an output current;

a first, master, transistor of a first conductivity type having collector, base, and emitter electrodes, for conducting an emitter bias current and for developing a forward bias voltage between said emitter and said base electrodes, responsive to said bias current;

a resistance having a first end connected to said emitter electrode and a second end connected to a point of reference potential;

a second, slave, transistor of said first conductivity type having collector, base, and emitter electrodes, said slave transistor being connected at its collector electrode to said output terminal, at its base electrode to the base electrode of said master transistor, and at its emitter electrode to said point of reference potential;

current splitting means having an input connected to said input terminal and having first and second outputs for providing thereat respective first and second predetermined and fixed fractions of said input current; means connecting said first output of said current splitting means to said collector electrode of said master transistor for providing said first fraction of said input current thereto; and means connecting said second output of said current splitting means to said first end of said resistance and said point of reference potential.

* * * * *